United States Patent
Den Boef et al.

(10) Patent No.: US 8,675,210 B2
(45) Date of Patent: Mar. 18, 2014

(54) LEVEL SENSOR, LITHOGRAPHIC APPARATUS, AND SUBSTRATE SURFACE POSITIONING METHOD

(75) Inventors: Arie Jeffrey Den Boef, Waalre (NL); Jozef Petrus Henricus Benschop, Veldhoven (NL); Ralph Brinkhof, 's-Hertogenbosch (NL); Willem Jurrianus Venema, Eindhoven (NL); Lukasz Jerzy Macht, Eindhoven (NL); Laurent Khuat Duy, Eindhoven (NL); Dimitra Sarri, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/603,168

(22) Filed: Sep. 4, 2012

(65) Prior Publication Data

US 2013/0077079 A1 Mar. 28, 2013

Related U.S. Application Data

(63) Continuation-in-part of application No. 12/722,955, filed on Mar. 12, 2010.

(60) Provisional application No. 61/160,126, filed on Mar. 13, 2009, provisional application No. 61/288,149, filed on Dec. 18, 2009.

(51) Int. Cl.
*G01B 11/14* (2006.01)

(52) U.S. Cl.
USPC .......................................... 356/614

(58) Field of Classification Search
None
See application file for complete search history.

(56) References Cited

U.S. PATENT DOCUMENTS

| | | | | |
|---|---|---|---|---|
| 3,344,700 | A | * 10/1967 | Brake | 356/616 |
| 4,195,909 | A | * 4/1980 | Holle et al. | 359/566 |
| 4,902,900 | A | 2/1990 | Kamiya et al. | |
| 5,101,226 | A | 3/1992 | Beaulieu et al. | |

(Continued)

FOREIGN PATENT DOCUMENTS

| | | |
|---|---|---|
| EP | 1 037 117 | 9/2000 |
| JP | 1-253603 | 10/1989 |

(Continued)

OTHER PUBLICATIONS

Chinese Office Action dated Dec. 3, 2012 in corresponding Chinese Patent Application No. 201110059239.2.

(Continued)

*Primary Examiner* — Gordon J Stock, Jr.
(74) *Attorney, Agent, or Firm* — Pillsbury Winthrop Shaw Pittman LLP

(57) ABSTRACT

A level sensor for measuring a position of a surface of a substrate includes a projection unit including an emitter for emitting a radiation beam towards the substrate and a projection grating including a measurement grating and an aperture, such that the radiation beam incident on the projection grating is divided into a measurement radiation beam and a capture radiation beam. The level sensor further includes a detection unit including a first and second measurement detector, a first and second capture detector, a detection grating, and a first and second optical unit. The detection grating includes a ruled grating with multiple rules, which direct radiation towards the first and second measurement detector via the first and second optical unit, and a capture element directing radiation towards the first and second capture detector via the first and second optical unit.

9 Claims, 8 Drawing Sheets

(56) References Cited

U.S. PATENT DOCUMENTS

| | | | |
|---|---|---|---|
| 5,191,200 A * | 3/1993 | van der Werf et al. | 250/201.4 |
| 5,241,188 A | 8/1993 | Mizutani | |
| 5,416,562 A * | 5/1995 | Ota et al. | 355/53 |
| 5,448,332 A | 9/1995 | Sakakibara et al. | |
| 5,461,237 A | 10/1995 | Wakamoto et al. | |
| 5,483,056 A * | 1/1996 | Imai | 250/201.4 |
| 5,510,628 A | 4/1996 | Georger, Jr. et al. | |
| 5,581,348 A | 12/1996 | Miura et al. | |
| 5,969,820 A | 10/1999 | Yoshii et al. | |
| 6,245,585 B1 | 6/2001 | Fujimoto | |
| 6,268,923 B1 | 7/2001 | Michniewicz et al. | |
| 6,320,658 B1 * | 11/2001 | Mizutani | 356/399 |
| 6,674,510 B1 | 1/2004 | Jasper et al. | |
| 6,704,089 B2 | 3/2004 | van der Schaar et al. | |
| 7,177,012 B2 | 2/2007 | Bleeker et al. | |
| 7,206,058 B2 | 4/2007 | Modderman et al. | |
| 7,224,431 B2 | 5/2007 | Mulkens et al. | |
| 7,411,667 B2 | 8/2008 | Van Asten et al. | |
| 2002/0006560 A1 | 1/2002 | van der Schaar et al. | |
| 2002/0125445 A1 | 9/2002 | Gelernt | |
| 2003/0193655 A1 | 10/2003 | Ina | |
| 2004/0165169 A1 | 8/2004 | Teunissen et al. | |
| 2004/0184018 A1 * | 9/2004 | Groeneveld et al. | 355/53 |
| 2005/0157281 A1 * | 7/2005 | Jasper et al. | 355/55 |
| 2005/0274909 A1 | 12/2005 | Teunissen et al. | |
| 2006/0082752 A1 | 4/2006 | Bleeker et al. | |
| 2006/0138347 A1 | 6/2006 | Bruinsma et al. | |
| 2006/0158626 A1 | 7/2006 | Baselmans et al. | |
| 2006/0274324 A1 | 12/2006 | Van Asten et al. | |
| 2007/0181827 A1 | 8/2007 | Tempelaars et al. | |
| 2007/0206204 A1 | 9/2007 | Jia et al. | |
| 2007/0229788 A1 | 10/2007 | Kosugi | |
| 2008/0079920 A1 | 4/2008 | Hommen et al. | |
| 2008/0151204 A1 | 6/2008 | Van De Vin et al. | |
| 2008/0309915 A1 * | 12/2008 | Van Asten et al. | 356/4.08 |
| 2009/0231563 A1 | 9/2009 | Staals et al. | |
| 2009/0296090 A1 | 12/2009 | Saha et al. | |
| 2010/0129741 A1 * | 5/2010 | Bijvoet | 430/30 |
| 2010/0231881 A1 * | 9/2010 | Den Boef et al. | 355/67 |
| 2010/0231889 A1 * | 9/2010 | Den Boef | 355/72 |
| 2011/0013171 A1 | 1/2011 | Mueller et al. | |
| 2011/0164229 A1 * | 7/2011 | Staals et al. | 355/53 |
| 2011/0222044 A1 * | 9/2011 | Van Drent | 355/72 |
| 2012/0013879 A1 * | 1/2012 | Den Boef et al. | 355/67 |
| 2013/0128247 A1 * | 5/2013 | Khuat Duy et al. | 355/63 |
| 2013/0162964 A1 * | 6/2013 | Thomas et al. | 355/55 |

FOREIGN PATENT DOCUMENTS

| | | |
|---|---|---|
| JP | 2-37709 | 2/1990 |
| JP | 4-045913 | 2/1992 |
| JP | 04-342111 | 11/1992 |
| JP | 6-066543 | 3/1994 |
| JP | H06-194358 | 7/1994 |
| JP | 7-074088 | 3/1995 |
| JP | 7-106243 | 4/1995 |
| JP | 8-068667 | 3/1996 |
| JP | 2000-323404 | 11/2000 |
| JP | 2002-340524 | 11/2002 |
| JP | 2004-281665 | 10/2004 |
| JP | 2009-182334 | 8/2009 |
| JP | 2011-209278 | 10/2011 |
| KR | 20-1995-0021360 | 3/1997 |
| KR | 10-2000-0022814 | 4/2000 |
| KR | 2009-0097809 | 9/2009 |
| KR | 2009-0125010 | 12/2009 |
| TW | 497012 | 8/2002 |

OTHER PUBLICATIONS

U.S. Office Action dated Dec. 21, 2012 in corresponding U.S. Appl. No. 12/722,902.
U.S. Office Action dated Jun. 21, 2013 in corresponding U.S. Appl. No. 12/722,955.
Chinese Office Action dated Jul. 26, 2013 in corresponding Chinese Patent Application No. 201110056943.2.
U.S. Office Action dated Mar. 22, 2013 in corresponding U.S. Appl. No. 13/045,052.
Taiwan Office Action dated Feb. 26, 2013 in corresponding Taiwan Patent Application No. 099107118.
R.A. Synowicki et al., "Refractive Index Measurements of Photoresist and Antireflective Coatings with Variable Angle Spectroscopic Ellipsometry", SPIE vol. 3332, pp. 384-390, Jun. 8, 1998.
Office Action in related Korean patent application No. 10-2010-0022284 dated May 16, 2011.
Singapore Search and Examination Report mailed Oct. 31, 2011 in corresponding Singapore Patent Application No. 201001507-1.
UR Korean Office Action dated Jan. 19, 2012 in corresponding Korean Patent Application No. 10-2010-0022284.
Japanese Office Action mailed Mar. 6, 2012 in corresponding Japanese Patent Application No. 2010-052645.
Korean Office Action dated Mar. 19, 2012 in corresponding Korean Patent Application No. 10-2010-0022284.
Korean Office Action dated Apr. 9, 2012 in corresponding Korean Patent Application No. 10-2011-0022123.
U.S. Office Action mailed Aug. 2, 2012 in corresponding U.S. Appl. No. 12/722,902.
U.S. Office Action mailed Jul. 2, 2012 in corresponding U.S. Appl. No. 13/178,965.
U.S. Notice of Allowance dated Sep. 5, 2013 in corresponding U.S. Appl. No. 13/045,052.
U.S. Office Action dated Jan. 2, 2014 in corresponding U.S. Appl. No. 12/722,955.

* cited by examiner

LEVEL SENSOR, LITHOGRAPHIC APPARATUS, AND SUBSTRATE SURFACE POSITIONING METHOD

This application is a continuation-in-part of co-pending U.S. patent application Ser. No. 12/722,955, filed Mar. 12, 2010, which claims priority and benefit to U.S. Provisional Patent Application Ser. No. 61/160,126, filed Mar. 13, 2009, and also to Provisional Patent Application Ser. No. 61/288,149, filed Dec. 18, 2009. The content of each of the foregoing applications is incorporated herein in its entirety by reference.

FIELD

The present invention relates to a level sensor for measuring a position of a surface of a substrate, a lithographic apparatus including said level sensor, and a method for positioning the surface of a substrate in a desired measurement range of the level sensor.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon substrate). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

European patent application EP-A-1 037 117 discloses a level sensor in a lithographic projection apparatus. Using this sensor a height map of a substrate in a lithographic map is determined by using grating optics and polychromatic radiation in the wavelength range of 600-1050 nm.

The level sensor of EP-A-1 037 117 uses a separate capture spot and detection spot, wherein the detection spot is used to determine the height map, and wherein the capture spot is used to capture the surface of the substrate within a desired measurement range of the detection spot, e.g. a linear or linearized measurement range.

The detection spot and capture spot are formed by illuminating a projection grating, wherein the projection grating comprises a grating for forming the detection spot and an additional aperture for forming a capture spot ahead of the detection spot on the substrate.

The detection spot is reflected by the substrate and is incident on a detection grating which is essentially a copy of the grating of the projection grating for determining the height map of the substrate surface.

The capture spot formed by the projection grating passes the detection grating, where it is incident on three separate detection regions. Two of the detection regions are set to high and one is set to low. The output of the low detection region is subtracted from those of the high regions. The capture spot detection regions are arranged so that when the substrate surface is at a zero position, the capture spot falls equally on the high and low detection regions and the subtracted output is zero. Away from the zero position, more of the capture spot will fall on one of the detection regions than the other and the subtracted output will increase in magnitude with its sign indicating whether the substrate is too high or too low.

However, the current level sensors as described above are not always satisfactory.

SUMMARY

It is desirable to provide an improved level sensor and operation thereof.

According to an aspect of the invention, there is provided a level sensor for measuring a position of a surface of a substrate comprising:
a) a projection unit; and
b) a detection unit;
wherein the projection unit comprises:
1) an emitter for emitting a radiation beam towards the substrate;
2) a projection grating positioned in between the emitter and the substrate, said projecting grating comprising a measurement grating and an aperture, such that the radiation beam from the emitter incident on the projection grating is divided by the projection grating into a measurement radiation beam associated with the measurement grating and a capture radiation beam associated with the aperture;
wherein the detection unit comprises:
a first and second measurement detector;
a first and second capture detector;
a detection grating; and
an optical system with a first optical unit and a second optical unit;
wherein the detection grating comprises a ruled grating with multiple rules,
wherein each rule of the multiple rules of the ruled grating comprises a first measurement facet associated with the first measurement detector and a second measurement facet associated with the second measurement detector;
wherein the first measurement facet is configured to refract radiation of the measurement radiation beam incident on said first measurement facet towards the first optical unit,
wherein the first optical unit is configured to divert radiation refracted by the first measurement facet to the first measurement detector;
wherein the second measurement facet is configured to refract radiation of the measurement radiation beam incident on said second measurement facet towards the second optical unit;
wherein the second optical unit is configured to divert radiation refracted by the second measurement facet to the second measurement detector;
wherein the detection grating comprises a first capture element having a first capture facet associated with the first capture detector and a second capture facet associated with the second capture detector, said second capture facet being adjacent to the first capture facet;
wherein the first capture facet is configured to refract radiation of the capture radiation beam incident on said first capture facet towards the first optical unit, wherein the first optical unit is configured to divert radiation refracted by the first capture facet to the first capture detector;

wherein the second capture facet is configured to refract radiation of the capture radiation beam incident on said second capture facet towards the second optical unit;

and wherein the second optical unit is configured to divert radiation refracted by the second capture facet to the second capture detector.

According to another aspect of the invention, there is provided a lithographic apparatus comprising:

a level sensor according to the invention; and a substrate support for supporting said substrate and positioning the surface of the substrate relative to the level sensor such that the measurement radiation beam and the capture radiation beam are able to be reflected by the surface of the substrate towards the detection unit of the level sensor.

According to a further aspect of the invention, there is provided a method for positioning the surface of a substrate in a desired measurement range of a level sensor according to the invention, said method comprising the following steps:

emitting a capture radiation beam towards the surface of the substrate to be reflected by the surface of the substrate;

moving the surface of the substrate until the capture radiation beam is incident on the first capture element and a difference between an output of the first capture detector and an output of the second capture detector is zero.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the drawings, like reference numerals indicate like parts.

DETAILED DESCRIPTION

Figure 1:
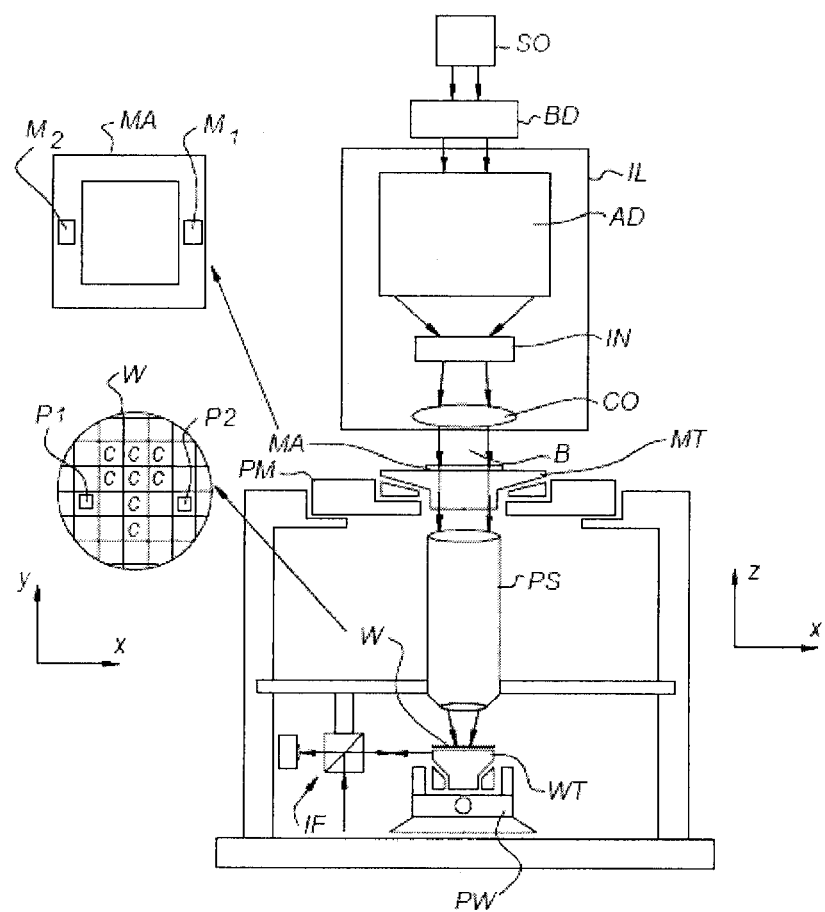
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device.

Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The embodiments of the present invention relate to methods and arrangements for performing a level sensor measurement relating to the substrate in the lithographic apparatus.

Figure 2:
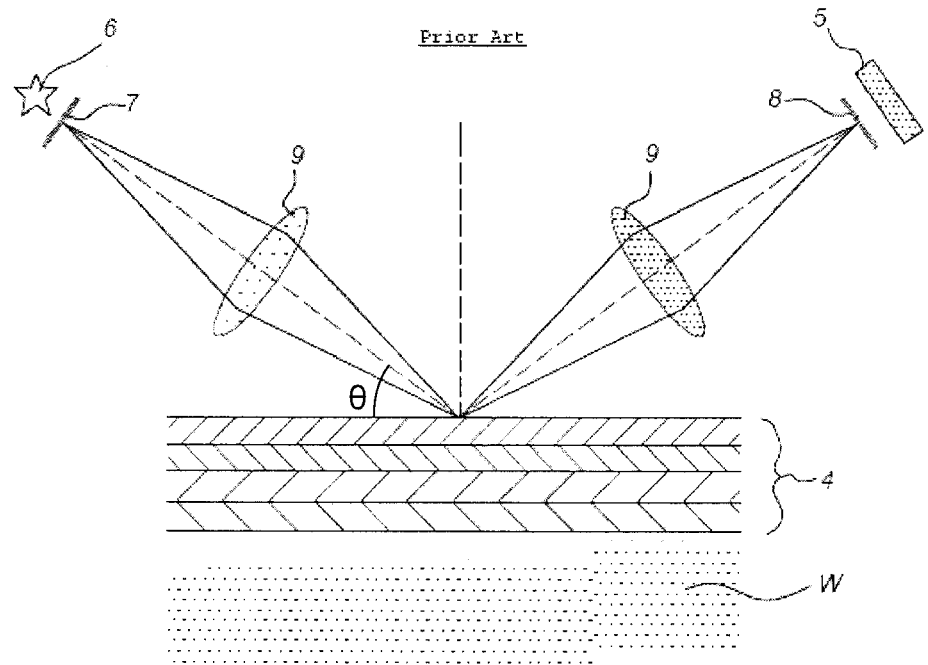
FIG. 2 depicts a schematic view of a sensor level arrangement using a projection grating.

In a level sensor according to the prior art, the level sensor determines a surface height or surface height profile of a substrate W. A generalized schematic diagram of a level sensor is shown in FIG. 2. Level sensor measurements are performed in all stages of substrate processing, also, when the substrate W already comprises a stack 4 of layers, such as oxide, poly-silicon, dielectric anti-reflective coating (DARC), metal layers (e.g. copper) and resist layers.

An emitter 6 (e.g. in the form of a light source) emits radiation at a pattern 7 (e.g. a grating having a pitch P of 30 μm), and the so formed radiation beam is projected on the substrate W (or top surface of the stack 4 of layers on the substrate W) using projection optics (e.g. in the form of a lens) 9, with an angle of incidence θ. The radiation used for level sensor measurements in lithographic apparatus has a wavelength range of 600-1050 nm, i.e. a wavelength range for which the resist used in processing of the substrate W is not sensitive. The reflected radiation is again focused using another lens 9 on a reference grating 8. A detector 5 is then used to process the radiation transmitted by the reference grating 8, and the measurement signal is processed to obtain the height of the stack 4 of layers. This level sensor is based on optical triangulation techniques. The detected height is directly related to the signal strength measured by the detector 5, and has a periodicity dependent on the angle of incidence (P/2 sin θ).

Figure 3:
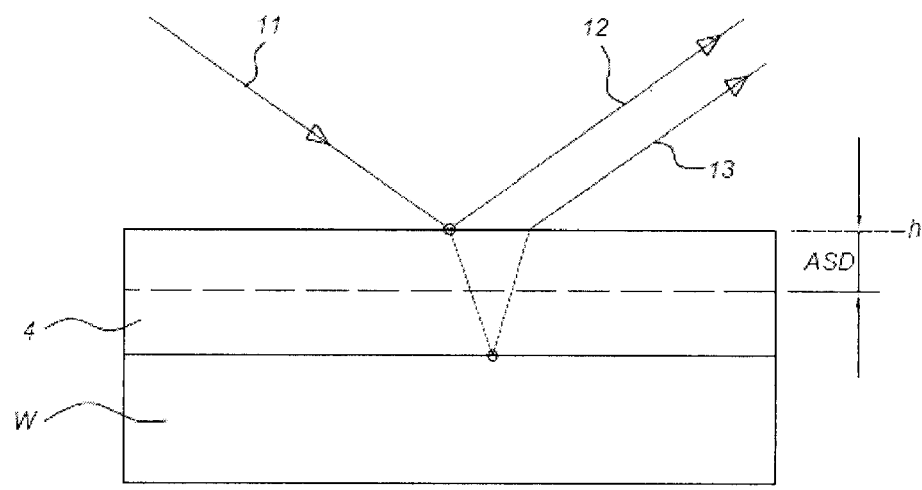
FIG. 3 depicts a schematic cross sectional view of a substrate with a stack of layers including measurement beams of the level sensor.

In practice the resist and underlying process layers of the stack 4 on the substrate W are (partially) transparent. Light with a specific wavelength reflected from an underlying process layer adds coherently to light reflected from the resist layer and this gives rise to stack interference effects that can lead to large measurement errors that depend on the precise layer thickness. In order to average-out these interference effects a broad wavelength range of about 1 octave is used. This is shown schematically in FIG. 3. An incident beam 11 partially reflects on the surface of stack 4 (comprising a resist layer only in this example) resulting in a reflected beam 12. However, part of the incident beam 11 is refracted into the stack 4, and reflected on the interface between substrate W and stack 4. At the surface of the stack 4 this beam is again refracted and forms a secondary beam 13, parallel to the reflected beam 12. As a result, not the correct height h of the stack 4 is taken into account, but a different value.

The difference between the measured height and the true resist height is called "Apparent Surface Depression" (ASD). This ASD is minimized by using broadband light with a wavelength range from e.g. 600-1050 nm which averages out the detrimental influence of stack interference effects.

The effect of ASD is corrected with an auxiliary sensor based on pressure or flow measurements between the wafer surface and a nozzle (air gauge), This sensor, however, is slow and it is therefore only used to do incidental calibrations on a few fields on the wafer. Moreover, it is in very close proximity to the substrate surface (=200 μm) which poses a potential machine safety issue that can only be resolved with costly safety measures. Finally, the use of two sensors further increases cost of goods.

Figure 4:
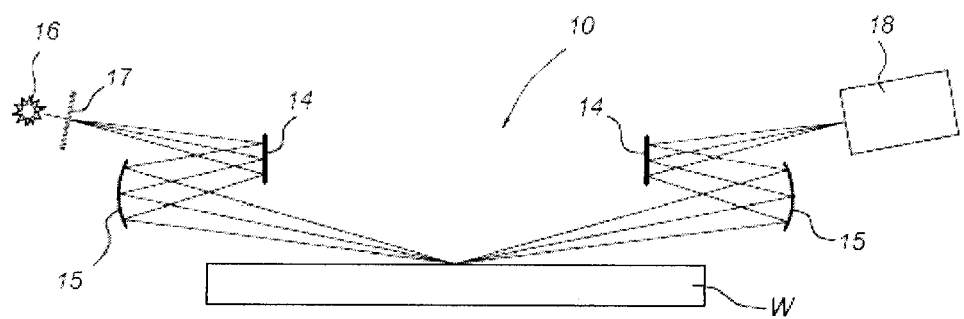
FIG. 4 depicts a schematic view of a sensor level arrangement according to an embodiment of the present invention.

In an embodiment (as shown in FIG. 4) of a level sensor 10 according to an embodiment of the present invention and to be used in a lithographic apparatus as described earlier (in relation to FIG. 1), a light source, i.e. an emitter 16, is used having a specific light spectrum, which emits radiation towards the substrate W. The radiation from the light source 16 is directed at a projection grating 17 positioned between the light source 16 and substrate W. Using a reflective projection system comprising mirrors 14 and 15 in the embodiment shown, the image formed by the projection grating 17 is projected on the substrate W. The reflected radiation from the substrate W is again optically focused using further reflective elements 14 and 15 to a detection unit 18. The detection unit 18 is e.g. provided with a UV sensor to measure the radiation reflected from the substrate W and to determine the substrate height (profile) from the reflected radiation in operation.

According to the present invention embodiments, the effect of ASD is reduced by using a light source 16 emitting a shorter wavelength of the incident beam 11 compared to prior art level sensors. More specifically, the light source 16 is arranged to emit radiation in a wavelength range in which a resist to be used for processing the substrate W in the lithographic apparatus is sensitive. In other words, the wavelength used in level sensor measurements in a lithographic apparatus is changed to a wavelength for which the resist used in substrate processing is susceptible, also indicated as actinic light (i.e. light radiation effecting chemical changes). Depending on the resist used, this means a measurement wavelength of less than 500 nm is implemented. E.g. in one embodiment, the wavelength used is lower than 400 nm (UV radiation), e.g. even lower than 300 nm (DUV radiation).

There are a number of reasons why a shorter wavelength improves process robustness. The refractive index of resist increases towards shorter wavelengths. This increases the reflectance at the resist-air interface and as a result less light penetrates the resist. Averaging of thin-film interference effects improves at shorter wavelengths for today's thin films. When copper (Cu) is used in the back-end advantage can be taken of the characteristic that copper has a significantly lower reflectance at shorter wavelengths. Furthermore, many modern process layers like poly-Si and a-C hardmask become opaque in the UV regime so the level sensor will "see" less of the underlying stack. For this effect, reference is made to the article 'Refractive Index Measurements of Photoresist and Antireflective Coatings with Variable Angle Spectroscopic Ellipsometry' by R. A. Synowicki et al, SPIE Vol. 3332, pp 384-390. In this article it is described that SiON, which is a known in-organic anti-reflection material used for coating substrates, is transparent at visible light wavelengths (k=0), but starts absorbing light energy at wavelengths of 400 nm and below.

At first sight the idea of using UV light in the level sensor sounds totally unacceptable since there is this "holy" rule that the substrate should never be exposed with actinic measurement light. However, when you look at the system requirements it turns out that leveling measurements can be done with very low light levels that are well below the normally used exposure energies. I.e. in a further embodiment, a dose (or energy level) of the radiation emitted towards the substrate W (as used for level sensor measurement) is below a predefined level, i.e. below a set threshold value, e.g. less than 0.1 mJ/cm$^2$. According to a further embodiment of the present invention, the level sensor measurement is executed in a lithographic apparatus as described above (with reference to FIG. 1), using a predefined level which is dependent on a stray light level allowed to exit the projection system PS. The threshold value of 0.1 mJ/cm$^2$ as mentioned before is deduced from a practical implementations of a lithography apparatus, wherein the projection system PS is allowed to have that level of stray light (about 1%) impinging on the substrate W during exposure with a mask pattern.

Another way to approach the setting of a threshold value is by starting from what energy is required to be able to provide a robust and repeatable measurement. The number of photons needed to achieve a reproducibility $\sigma_h$ is approximately:

$$N_{ph} \cong \frac{P^2}{16\sigma_h^2}$$

In case the parameters are chosen as $\sigma_h=1$ nm and P=30 µm, this value becomes $N_{photons} \approx 6\times10^7$. Assuming a photo detector efficiency of 10%, a detection optics efficiency of 75%, and a resist reflection (i.e. specular reflection) of 20%, which are conservative values, the number of photons incident on resist would be $N_{photons}=4\times10^9$. With a mean energy per photon of $6.6\times10^{-19}$ J and an illuminated area of $2.5\times2.5$ mm$^2$ this would require an energy density incident on the substrate of $\approx4\times10^{-5}$ mJ/cm$^2$. This is orders of magnitude below the UV stray light requirement in imaging ($\approx 0.1$ mJ/cm$^2$).

Even when the energy dose of the measurement light transmitted by the level sensor 10 exceeds the predefined threshold value, it is possible to use this technique by a small change to the subsequent exposure step of the lithographic apparatus as described above (with reference to FIG. 1). In this embodiment, the illumination system IL is further arranged to apply an exposure level offset in case the level sensor has applied radiation with a dose (or energy level) above the predefined threshold value. In other words, the level sensor in the lithographic apparatus is operated with a dose (or energy level) of the measurement radiation above the threshold value on a substrate W, after which a dose correction is applied in a subsequent exposure step of that substrate W. In this way the exposure with measurement light by the level sensor introduces a predictable CD offset across the substrate W that can be corrected with a small dose reduction during the actual exposure.

In an even further embodiment, the level sensor 10 is arranged to provide a predictable distribution of the photon energy of the measurement light across the substrate W, e.g. a homogeneous distribution. When the actual distribution of measurement energy is known, it is then possible to apply a very simple dose reduction during actual exposure of the substrate W, depending on the distribution of energy during level sensor measurement.

In one specific embodiment, a light source 16 is used which has specific characteristics which make it suitable for use in the present level sensor. A deuterium source 16 has a wavelength spectrum from about 200-400 nm, wherein the spectral irradiance is higher for the shorter wavelength range. It is therefore particularly suited for obtaining an improved level sensor where the stack 4 of layers has little or no influence on the height measurement, due to the lower sensitivity for layer interference at lower wavelengths.

The detection unit 18 is in a further embodiment provided with matched elements, such as radiation detectors 35, 36 (see also the description with reference to FIG. 6 below). Matched detectors 35, 36 have a sensitivity profile as function of wavelength which substantially inversely matches the energy profile as function of wavelength in the light source. In other words, the detection characteristic in the wavelength range as used is complementary to that of light source 16.

Alternatively or in addition, other (optical) elements of the detection unit 18, such as mirror reflectance or transmission through illumination fibers may be adapted to obtain the matched characteristics. E.g. when using a deuterium source which has a higher energy in the lower wavelengths, the detection unit 18 (or more specific the radiation detectors 35, 36) is chosen to be more sensitive in the higher portion of the wavelength range used. Using these types of matching it is possible to provide a level sensor 10 with a substantially flat system response as function of wavelength.

Known level sensors project a grating on the substrate W at an oblique angle θ, as shown in the embodiments of both FIG. 2 and FIG. 4. The reflected image is projected on a detection grating (e.g. reference grating 8 in FIG. 4). A vertical displacement Z of the substrate W shifts the grating image over the detection grating which results in an intensity variation of the light that is transmitted by the grating. This intensity variation is proportional to the Z-displacement but the intensity also varies due to light source intensity variations or substrate (specular) reflection variations. In order to eliminate these variations a differential detection scheme is used. In such a known detection set-up of a detection unit 5, a combination of a polarizer 21 and shear plate 22 (e.g. in the form of a Wollaston prism) produces two laterally sheared grating images ('e' and 'o') from the reflected beam 20 on a reference grating 23, as shown schematically in FIG. 5. The 'e' and 'o' images that are transmitted by the reference grating 23 are imaged onto two detectors 25 and 26 respectively by optical unit 24 to be detected by two detectors (respectively, 25 and 26) and processed in processing unit 27 to yield a normalized height signal h.

This known set up of the detection unit 5 has a number of disadvantages. Polarization optics (such as polarizer 21) are expensive and the price rapidly increases for larger sizes. This increases cost of goods the level sensor is scaled up to a larger Field of View. The Wollaston prism/shear plate 22 is chromatic which produces a λ-dependant shift. This shift results in a color-dependant height error. This is probably acceptable at longer wavelengths where dispersion of the Wollaston prism 22 is low but this shift rapidly increases towards the UV wavelengths.

According to an embodiment of the present invention a relatively shallow ruled grating 31 with a triangular grating profile is used instead of using an amplitude transmission grating. Such a set-up of the detection unit 18 according to an embodiment is shown schematically in FIG. 6. The detection unit 18 as shown comprises a ruled grating 31 which acts as a phase grating. The pitch P of the ruled grating 31 is larger than the wavelength of the radiation emitted by the light source 16. The pitch P is e.g. equal to the period of the image of the projection grating 17 (see FIG. 4), e.g. 30 µm. In FIG. 6 a transmission grating 31 is shown, but as an alternative a ruled reflection grating is useable. For a transmission grating 31, a suitable material would be MgF, which is sufficiently transparent at the used wavelengths (at more than 120 nm).

The triangular grating profile of the ruled grating 31 acts as a series of wedges 31a, 31b, which redirects the light beam 20 according to the well-known Snell's law. The image that is on a positive wedge 31a is redirected in an upward direction ('u') and the image that is on a negative wedge 31b is redirected in a down ward direction ('d'). If the image is exactly centered on the ruled grating 31 then the 'u' and 'd' images have equal intensity and the output 'h' of a processing unit 37 connected to two detectors 35, 36 will be zero. If the substrate height changes then the image of the projection grating 31 will also shift and this will result in an unbalance between the 'u' and 'd' signals.

Figure 5:
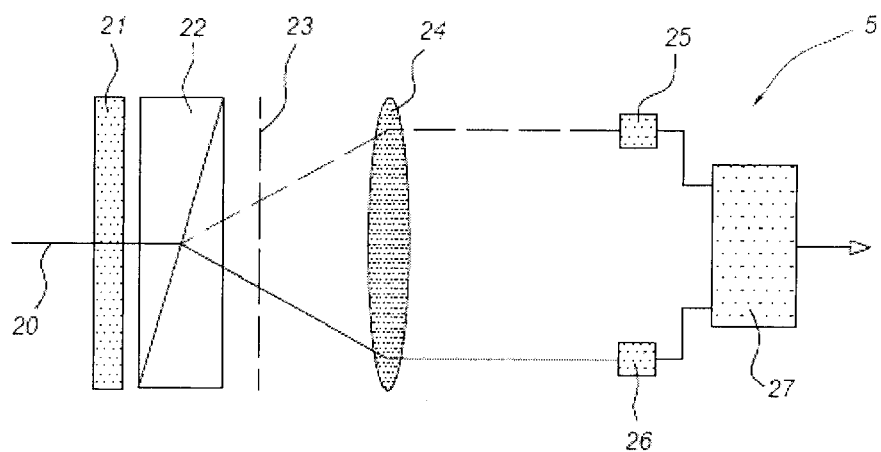
FIG. 5 depicts a cross sectional view of a part of a detection unit.

The angle between the 'u' and 'd' beams should be more than the divergence of the image that is incident on the projection grating 17. Moreover, the ruled grating 31 introduces additional divergence of the light due to the wavelength dependant refraction (only in case of a transmission grating) and due to diffraction that occurs at the finite size of the wedges. The divergence caused by diffraction is roughly given by 2λ/P. The total extra divergence is small (of the order of 0.1 radians) and is acceptable in a practical design. It should also be note that the diffraction-induced additional divergence is also found in the current polarization-based detection branch (as shown in FIG. 5).

Figure 6:
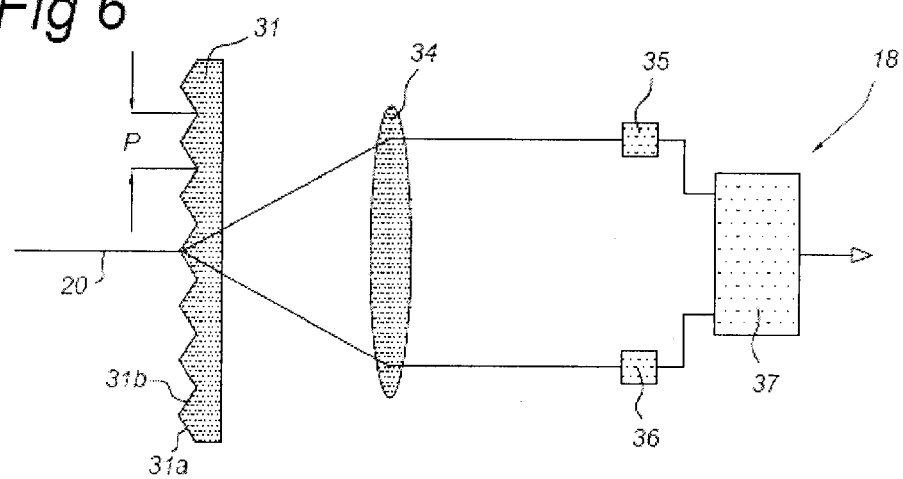
FIG. 6 depicts a cross sectional view of a part of a detection unit according to an embodiment of the present invention.

The detection unit 18 embodiment of FIG. 6 provides a number of advantages. E.g. the current embodiment has low cost compared to the state of the art solutions. Especially in the UV region, polarizers 21 and shear plates 22 are very expensive. Furthermore, the detection unit 18 has no wavelength dependent height offset. Also, it can be easily scaled in size for a large-field level sensor.

Also, the new set-up is very light efficient. No light is blocked since a phase grating 31 is used rather than an amplitude grating 8. As a result more photons are available for the measurement. This embodiment of the detection unit 18 is particularly suitable for the UV level sensor embodiments described above. However, it may also be of interest for state of the art level sensors using visible light wavelengths as a cost-of-goods reduction.

Ruled gratings 31 are known as such and used in e.g. spectroscopy. For many applications ruled gratings 1 are made with a blaze angle. In the present embodiments the blaze is not needed or equal to zero, i.e. the positive and negative wedges 31a, 31b are at the same angle to the normal of ruled grating 31.

Simulations have been performed, were a level sensor has been used in one occasion with a wavelength range of 500-1000 nm, and another occasion (using the above described embodiments) with a wavelength range of 200-400 nm. The apparent surface depression (ASD) was determined as function of the incidence angle θ (indicated as angle of incidence or AOI in FIGS. 7b and 8b).

Figure 7A:
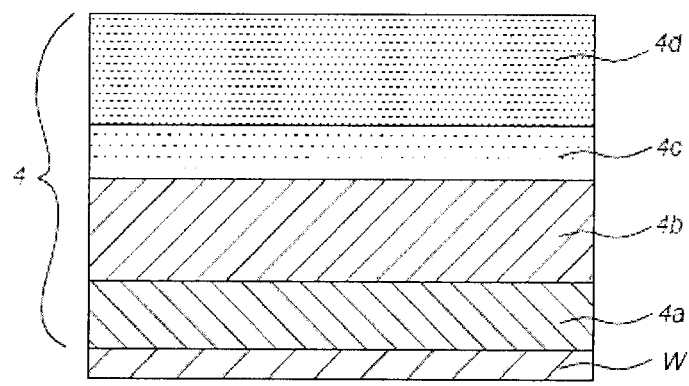
FIG. 7a depicts a cross sectional view of a typical front end stack on a substrate and FIG. 7b depicts graphs of the apparent surface depression of the substrate with front end stack as function of angle of incidence for two wavelength ranges.
Figure 7B:
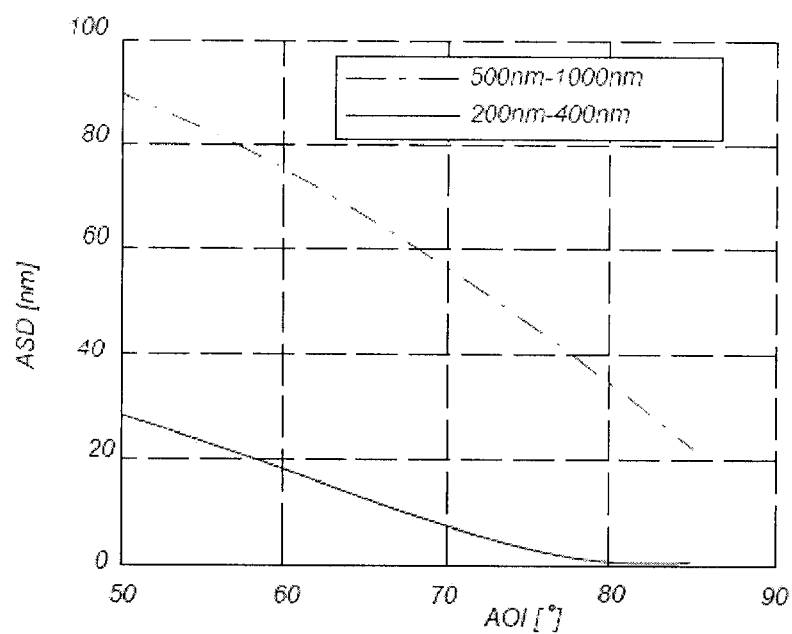

In a first simulation, typical for a front end stack 4 of layers on a substrate W, a stack 4 on a substrate W was used comprising (in order from bottom to top: a 50 nm oxide layer 4a, a 70 nm poly-silicon layer 4b, a 40 nm dielectric anti-reflective coating (DARC) layer 4c and an 80 nm resist layer 4d (see FIG. 7a). The resulting ASD's are much better for the low wavelength range. This is clearly visible in the graph of FIG. 7b.

Figure 8A:
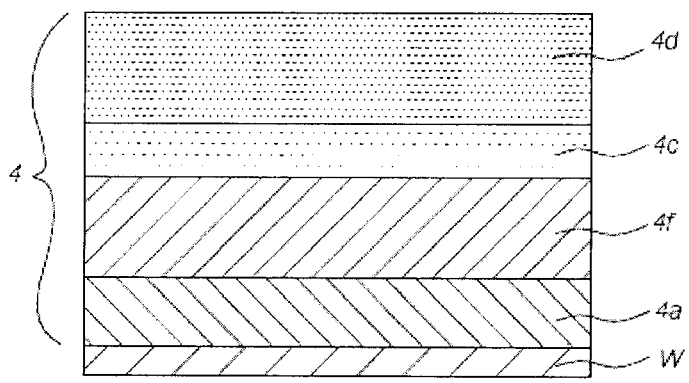
FIG. 8a depicts a cross sectional view of a typical back end stack on a substrate and FIG. 8b depicts graphs of the apparent surface depression of the substrate with back end stack as function of angle of incidence for two wavelength ranges.
Figure 8B:
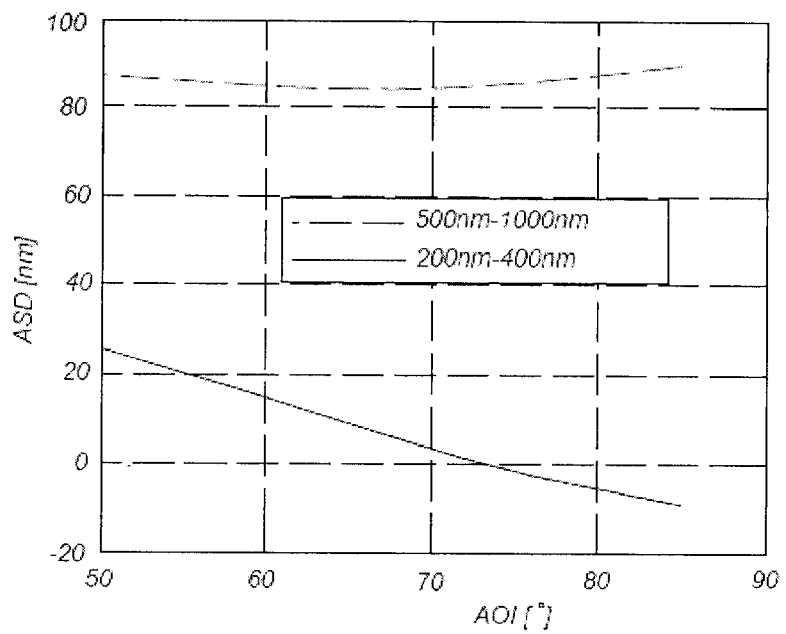

In a second simulation, typical for a back end stack 4 of layers on a substrate W, a stack 4 on a substrate W was used comprising (in order from bottom to top: a 50 nm oxide layer 4a, a 70 nm copper layer 4e, a 40 nm dielectric anti-reflective coating (DARC) layer 4c and an 80 nm resist layer 4d (see FIG. 8a). The resulting ASD's are again much better for the low wavelength range measurements. This is clearly visible in the graph of FIG. 8b.

Figure 9:
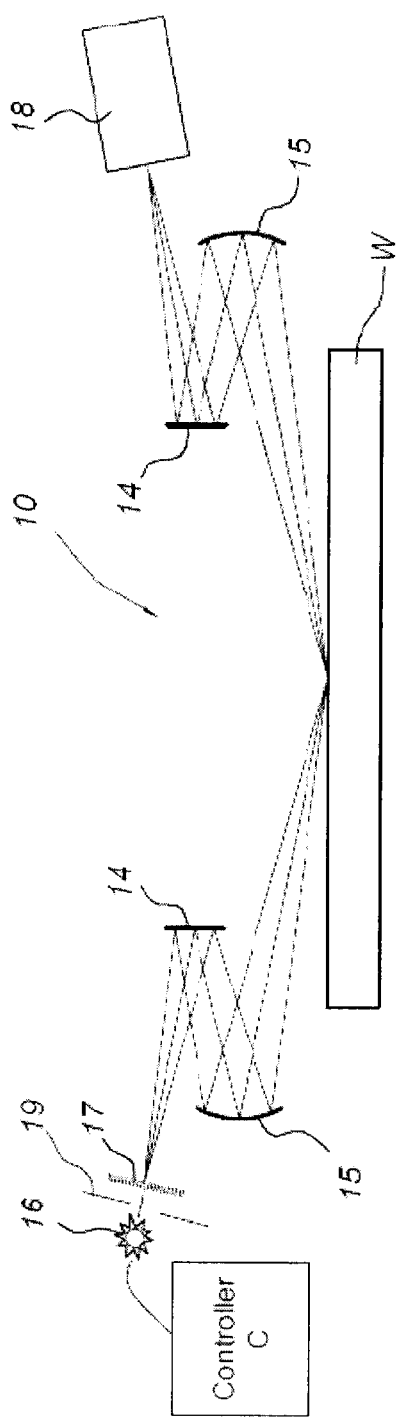
FIG. 9 depicts a schematic view of a level sensor according to another embodiment of the present invention.

In an embodiment that may usefully be combined with any of the foregoing described embodiments, actinic light from the light source 16 is prevented from impinging on the substrate W during alignment scans, or indeed during any time period in which level sensing is not required or useful. This result may be achieved as illustrated in FIG. 9 by way of the incorporation of a shutter 19 that is controllably closed as desired. As will be appreciated, the shutter 19 need not be in located upstream from the projection grating 17, but may be placed anywhere convenient within the optical path between the light source 16 and the substrate W. However, placing the shutter close to the light source may reduce the potential problem of reflected stray light and heating of the optical path. In another approach, a controller C is provided that is operable to shut off the light source during times that it is not in use. This approach, while mechanically simpler than a shutter, has the potential drawback that system stability may be impacted due to the required switching.

Figure 10A:
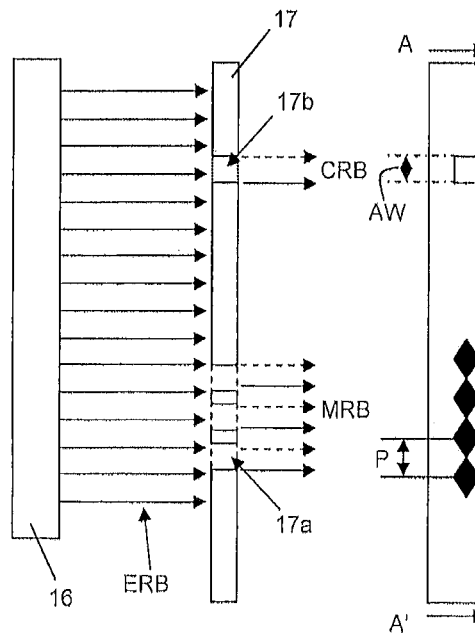
FIG. 10A depicts a schematic cross section of a projection grating of a level sensor according to an embodiment of the invention.

FIG. 10A schematically depicts an example of a projection unit including an emitter 16 and a projection grating 17, which projection unit is part of a level sensor according to an embodiment of the invention, e.g. the embodiments described above.

Figure 10B:
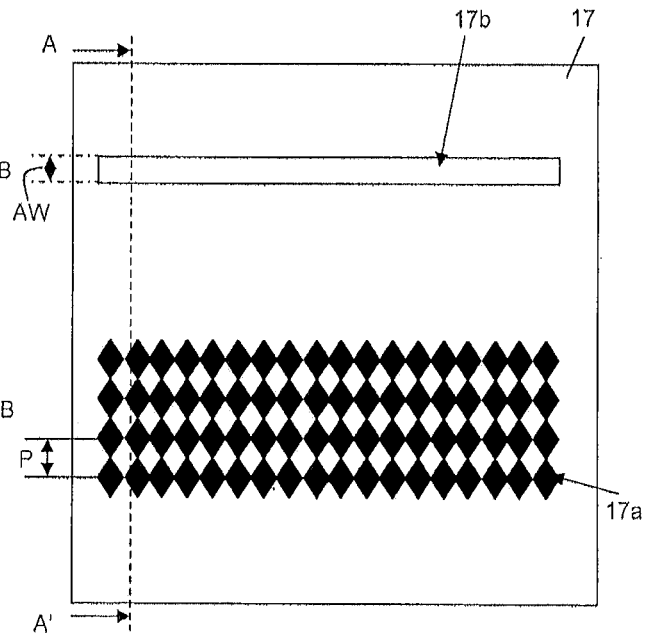
FIG. 10B depicts a schematic front view of the projection grating of FIG. 10A.

FIG. 10B depicts a front view of the projection grating 17 of FIG. 10A. FIG. 10A shows a cross section of the projection grating 17 along line A-A' as shown in FIG. 10B.

The emitter 16 emits a radiation beam ERB towards the projection grating 17.

The projection grating 17 comprises a measurement grating 17a and an aperture 17b, such that the radiation beam ERB incident on the projection grating 17 is divided by the projection grating 17 into a measurement radiation beam MRB associated with the measurement grating 17a, and a capture radiation beam CRB associated with the aperture 17b.

The measurement grating 17a has a pitch P in this example, e.g. a pitch of 30 or 40 μm. The image formed by the measurement grating 17a is directed towards a surface of a substrate for measurement purposes. The aperture 17b has a width AW and this forms a capture radiation beam having a corresponding beam width.

The measurement grating 17a has been embodied here as a periodic structure of diamond shaped openings, but the skilled person is well aware that other periodic structures may also be used to form a measurement radiation beam having a periodic structure in radiation intensity.

The projection grating 17 is arranged such that the capture radiation beam is reflected by the surface of the substrate at a location in front of the measurement radiation beam when scanning over the substrate's surface. This allows using the capture radiation beam to position the surface of the substrate in a desired measurement range of the measurement radiation beam.

Figure 11A:
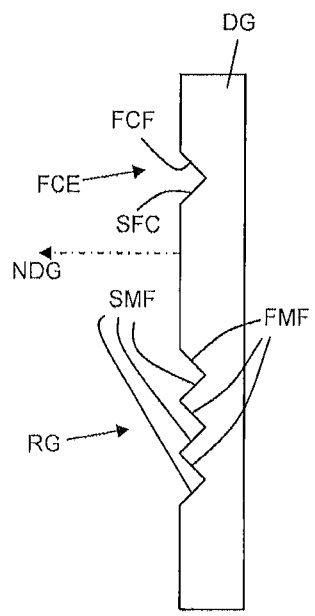
FIG. 11A depicts schematically a cross section of a detection grating of a level sensor according to an embodiment of the invention.
Figure 11B:
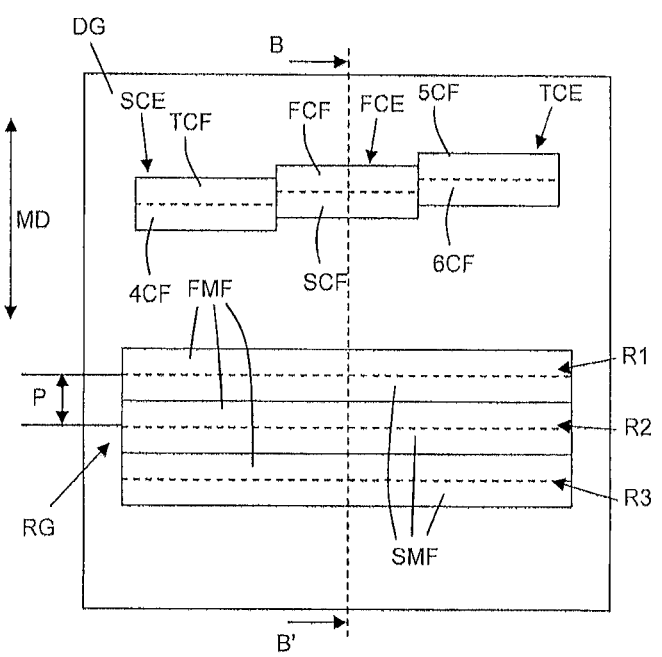
FIG. 11B depicts schematically a front view of the detection grating of FIG. 11A.

FIG. 11A and FIG. 11B depict a detection grating DG which is part of a detection unit as for instance shown in FIGS. 4 and 9. FIG. 11A depicts a cross section of the detection grating along lines B-B' as shown in FIG. 11B.

The detection grating of FIG. 11A and FIG. 11B is in this example intended to be used in combination with the projection grating 17 of FIG. 10A and FIG. 10B, and comprises a ruled grating RG with multiple rules R1, R2, R3. The ruled grating is similar to the ruled grating 31 shown in FIG. 6.

In the context of the invention, a ruled grating at least includes an optical element having grooves arranged in a surface thereof, each groove forming a rule of the ruled grating.

The pitch P of the ruled grating RG is larger than the wavelength of the radiation emitted by the emitter of the projection unit and is preferably equal to the period of the image of the projection grating 17 (see FIGS. 10A and 10B), e.g. 30 μm. In FIG. 11A and FIG. 11B, a ruled transmission grating is shown, but the same principles described below can also be similarly applied to a ruled reflection grating.

The measurement radiation beam and capture radiation beam of the projection unit are to be diverted to the detection grating DG, such that a displacement of the surface of the substrate from or to the level sensor will shift the measurement radiation beam and capture beam over the detection grating in a measurement direction MD.

The ruled grating RG extends perpendicular to the measurement direction MD. The measurement radiation beam and the capture radiation beam are diverted to the detection grating such that the pattern in the measurement radiation beam and the capture radiation beam also extend perpendicular to the measurement direction MD.

Each rule R1, R2, R3 of the ruled grating RG comprises a first measurement facet FMF (corresponding to the positive wedge 31a of FIG. 6), and a second measurement facet SMF (corresponding to the negative wedge 31b of FIG. 6). The first and second measurement facets refract, i.e. direct, radiation incident on the respective measurement facet towards an associated optical unit configured to divert said refracted radiation to a respective detector as will be explained below with reference to FIG. 12.

The detection grating DG further comprises a first capture element FCE comprising a single first capture facet FCF and a single second capture facet SCF. The first and second capture facets refract, i.e. direct, radiation incident on said respective capture facet towards an associated optical unit configured to divert said refracted radiation onto a respective detector as will be explained below with reference to FIG. 12.

Figure 12:
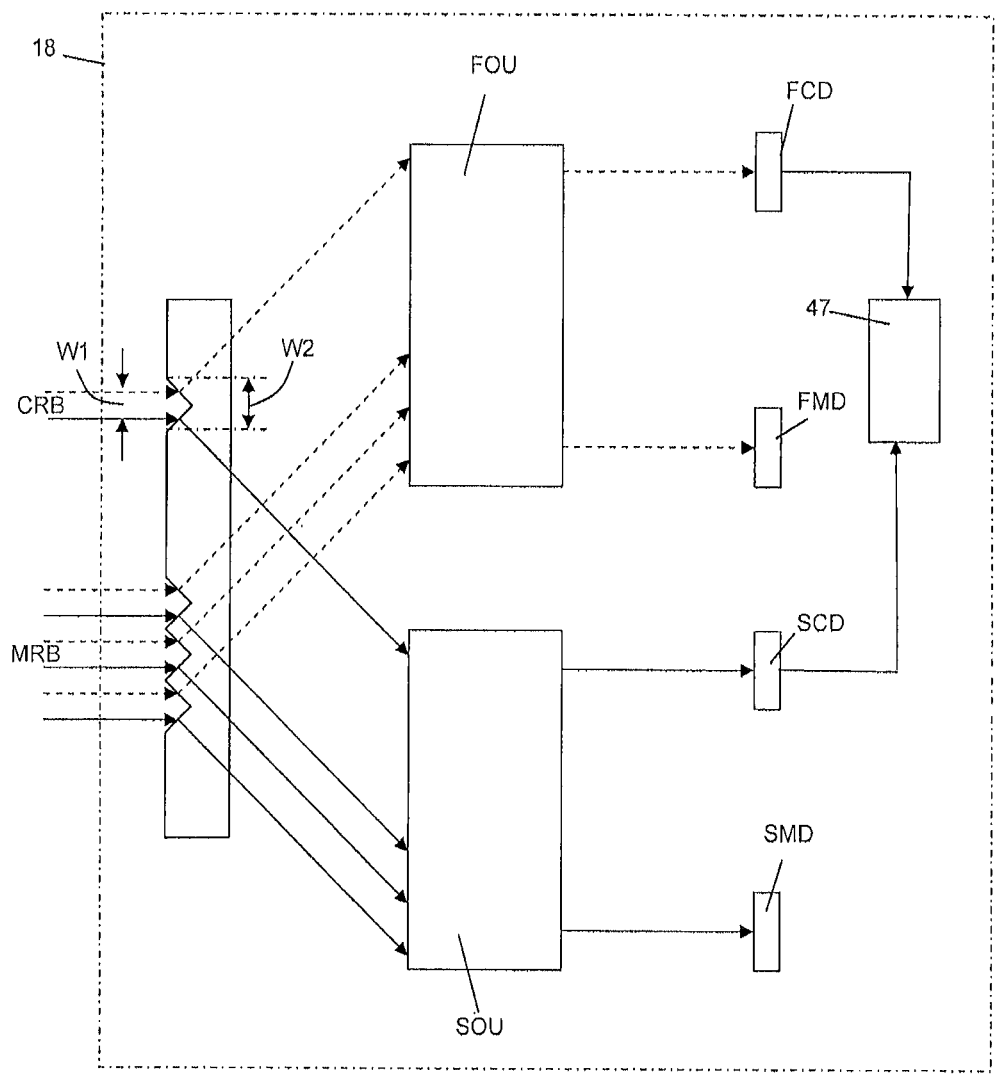
FIG. 12 depicts schematically a detection unit of a level sensor according to an embodiment of the invention employing the detection grating of FIGS. 11A and 11B.

FIG. 12 depicts a detection unit 18 in which the detection grating DG of FIG. 11A and FIG. 11B is used. The detection unit 18 is part of a level sensor also comprising a projection unit in accordance with FIGS. 10A and 10B, so that a measurement radiation beam MRB and a capture radiation beam CRB are emitted by the projection unit 17 to the surface of a substrate as described in relation to FIGS. 10A and 10B. Both radiation beams MRB, CRB are reflected, preferably specularly reflected, of the substrate's surface towards the detection unit 18.

The detection unit 18 comprises a first measurement detector FMD, a second measurement detector SMD, a first capture detector FCD, a second capture detector SCD, a detection grating DG, and an optical system with a first optical unit FOU and a second optical unit SOU.

Radiation of the measurement radiation beam MRB incident on the first measurement facets FMF of the ruled grating RG is refracted towards the first optical unit FOU, wherein the first optical unit FOU is configured to divert the by the first measurement facets refracted radiation to the first measurement detector FMD. The optical paths of radiation incident on the first measurement facets and directed towards the first measurement direction are indicated by dashed arrows.

Radiation of the measurement radiation beam MRB incident on the second measurement facets SMF of the ruled grating RG is refracted towards the second optical unit SOU, wherein the second optical unit SOU is configured to divert the by the second measurement facets refracted radiation to the second measurement detector SMD. The optical paths of radiation incident on the second measurement facets and directed towards the second measurement direction are indicated by solid arrows.

Radiation of the capture radiation beam CRB incident on the first capture facet FCF of the first capture element FCE is refracted towards the first optical unit FOU, wherein the first optical unit FOU is configured to divert the by the first capture facet refracted radiation to the first capture detector FCD. The optical path of radiation incident on the first capture facet and directed towards the first capture direction is indicated by a dashed arrow.

Radiation of the capture radiation beam CRB incident on the second capture facet SCF of the first capture element FCE is refracted towards the second optical unit SOU, wherein the second optical unit SOU is configured to divert the by the second capture facet refracted radiation to the second capture detector SCD. The optical path of radiation incident on the second capture facet and directed towards the second capture direction is indicated by a solid arrow.

Hence, the first measurement facets and the first capture facet are associated with the first optical unit and with the first measurement detector and first capture detector respectively, and the second measurement facets and the second capture facet are associated with the second optical unit and with the second measurement detector and second capture detector respectively.

As a result, the first and second optical unit can be used to divert both the respective measurement radiation and the capture radiation to the respective detectors, and no additional or separate optical elements are required. This is very cost efficient.

How the measurement detectors can be used to determine the height of the surface of the substrate has already been described with reference to FIGS. 4 and 6.

The first and second capture detector are preferably connected to a processing unit 47 configured to determine a difference between an output of the first capture detector and an output of the second capture detector. Said difference can also be referred to as a difference signal.

The capture radiation beam CRB can be scanned over the detection grating DG in the measurement direction MD, by moving a surface of a substrate away or from the level sensor using a suitable substrate support. The width W1 of the diverted capture radiation beam is preferably smaller than a width W2 of the first capture element.

Depending on the scanning direction, i.e. a positive or negative scanning direction, an intensity of radiation of the capture radiation beam CRD will first increase on one of the first or second capture facet FCF, SCF, subsequently progressively diminish to the benefit of the other one of the first or second capture facet FCF, SCF, and finally the intensity at the other one of the first or second capture facet will diminish as the capture radiation beam leaves the first capture element. When both the first and second capture facet are equally illuminated, the difference between the output of the respective capture detectors will be zero, and this point usually corresponds to the desired measurement range of the level sensor, so that the ruled grating RG is properly illuminated by the measurement radiation beam.

The detection grating of FIGS. 11A and 11B may also comprise a second and third capture element SCE, TCE as shown in FIGS. 11A, 11B, which are offset in the measurement direction MD relative to the first capture element FCE and relative to each other. The second and the third capture element are similar to the first capture element, so that the second capture element has a third capture facet TCF corresponding to the first capture facet and a fourth capture facet 4CF corresponding to the second capture facet, and the third capture element has a fifth capture facet 5CF corresponding to the first and third capture facet and a sixth capture facet 6CF corresponding to the second and fourth capture facet.

The detection unit further comprises a third, fourth, fifth and sixth capture detectors to detect radiation originating from the third, fourth, fifth and sixth capture facets respectively in the same manner as the first and second capture detectors. The first optical unit is configured to divert the radiation originating from the third and fifth capture facets to the third and fifth capture detector respectively, and the second optical unit is configured to divert the radiation originating from the fourth and sixth capture facets to the fourth and sixth capture detector respectively.

The processing unit 47 is configured to also determine the difference between an output of the third capture detector and an output of the fourth capture detector, and between an output of the fifth capture detector and an output of the sixth capture detector. An example of the three determined difference signals is shown in FIG. 13 in which the signal FDS corresponds to the difference between the first and second capture detectors, the signal SDS corresponds to the difference between the third and fourth capture detectors, and the signal TDS corresponds to the difference between the fifth and sixth capture detectors. Due to the offsets between the first, second and third capture element, the difference signals are equal but also offset relative to each other. This makes it possible to more accurately determine the zero crossing of the first difference signal FDS.

In the shown embodiment, the first, second and third capture element are offset relative to each other by ¼ of the width of a capture element, so that a zero first difference signal corresponds to a minimum second difference signal and a maximum third difference signal and a clear distinction can be made between a situation in which the first capture element is not illuminated at all and thus the difference signal is also zero.

In an alternative embodiment, the processing unit may determine the zero crossing of the first difference signal by also looking at the individual output signals of the corresponding first and second capture detector which have to be non-zero to make a clear distinction between the situation in which the first capture element is not illuminated at all and thus the difference signal is also zero.

In an embodiment, the first measurement facets and the first capture facet have the same orientation relative to the normal NDG of the detection grating.

In an embodiment, the second measurement facets and the second capture facet have the same orientation to the normal NDG of the detection grating.

In an embodiment, the detection unit comprises a third measurement detector, the optical system comprises a third optical unit, and each rule of the multiple rules of the detection grating comprises a third measurement facet associated with the third measurement detector. The third measurement facet is then configured to refract radiation of the measurement radiation beam incident on said third measurement facet towards the third optical unit, wherein the third optical unit is configured to divert radiation refracted by the third measurement facet to the third measurement detector. It is explicitly mentioned here that as with the third measurement facet, third optical unit and third measurement detector, more measurement facets, optical units and measurement detectors can be used. In addition, the capture element may comprise more than two capture facets.

In an embodiment, the capture elements are embodied as respective grooves.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A level sensor for measuring a position of a surface of a substrate comprising:
   a projection system; and
   a detector;
   wherein the projection system comprises:
      an emitter for emitting a radiation beam towards the substrate;
      a projection grating positioned in between the emitter and the substrate, said projection grating comprising a measurement grating and an aperture, such that the radiation beam from the emitter incident on the projection grating is divided by the projection grating into a measurement radiation beam associated with the measurement grating and a capture radiation beam associated with the aperture;
   wherein the detector comprises:
      a first and second measurement detector;
      a first and second capture detector;
      a detection grating; and
      an optical system with a first optical unit and a second optical unit;
   wherein the detection grating comprises a ruled grating with multiple rules,
   wherein each rule of the multiple rules of the ruled grating comprises a first measurement facet associated with the first measurement detector and a second measurement facet associated with the second measurement detector;
   wherein the first measurement facet is configured to refract radiation of the measurement radiation beam incident on said first measurement facet towards the first optical unit, wherein the first optical unit is configured to divert radiation refracted by the first measurement facet to the first measurement detector;

wherein the second measurement facet is configured to refract radiation of the measurement radiation beam incident on said second measurement facet towards the second optical unit;

wherein the second optical unit is configured to divert radiation refracted by the second measurement facet to the second measurement detector;

wherein the detection grating comprises a first capture element having a first capture facet associated with the first capture detector and a second capture facet associated with the second capture detector, said second capture facet being adjacent to the first capture facet;

wherein the first capture facet is configured to refract radiation of the capture radiation beam incident on said first capture facet towards the first optical unit, wherein the first optical unit is configured to divert radiation refracted by the first capture facet to the first capture detector;

wherein the second capture facet is configured to refract radiation of the capture radiation beam incident on said second capture facet towards the second optical unit; and wherein the second optical unit is configured to divert radiation refracted by the second capture facet to the second capture detector.

2. A level sensor according to claim 1, wherein the first capture facet has a same orientation as the first measurement facet, and wherein the second capture facet has a same orientation as the second measurement facet.

3. A level sensor according to claim 1, wherein the aperture and first capture element are configured such that a width of the capture radiation beam is smaller than a width of the first capture element, such that the capture radiation beam is not able to illuminate the entire first and second capture facet.

4. A level sensor according to claim 1, wherein the radiation beam emitted by the emittter comprises radiation having a wavelength of less than 400 nm.

5. A lithographic apparatus comprising:
a level sensor according to claim 1; and
a substrate support for supporting said substrate and positioning the surface of the substrate relative to the level sensor such that the measurement radiation beam and the capture radiation beam are able to be reflected by the surface of the substrate towards the detector of the level sensor.

6. A lithographic apparatus according to claim 5, comprising a control unit to process outputs of the first and second capture detectors, wherein the control unit is configured to determine a difference between an output of the first capture detector and an output of the second capture detector, and to drive the substrate support based on the determined difference in order to position the surface of the substrate in a desired measurement range of the level sensor in which a height map of the surface of the substrate can be determined using the measurement radiation beam and the first and second measurement detectors.

7. A lithographic apparatus according to claim 6, wherein the control unit is configured to position the surface of the substrate at a position in which the difference between the output of the first capture detector and the output of the second capture detector is zero, and in which the outputs of the first and second capture detectors are non-zero.

8. A lithographic apparatus according to claim 6, wherein: the detection grating comprises a second capture element, wherein the detector comprises a third and a fourth capture detector, wherein the second capture element has a third capture facet associated with the third capture detector and a fourth capture facet associated with the fourth capture detector, said fourth capture facet being adjacent to the third capture facet;

wherein the third capture facet is configured to refract radiation of the capture radiation beam incident on said third capture facet towards the first optical unit, wherein the first optical unit is configured to divert radiation refracted by the third capture facet to the third capture detector;

wherein the fourth capture facet is configured to refract radiation of the capture radiation beam incident on said fourth capture facet towards the second optical unit;

wherein the second optical unit is configured to divert radiation refracted by the fourth capture facet to the fourth capture detector;

wherein the capture radiation beam is configured to illuminate both the first and second capture element, and wherein the first and second capture element are offset with respect to each other; and wherein the control unit is configured to determine a difference between an output of the third capture detector and an output of the fourth capture detector, and wherein the control unit is configured to position the surface of the substrate at a position in which the difference between the output of the first capture detector and the output of the second capture detector is zero, and in which the difference between the output of the third capture detector and the output of the fourth capture detector is non-zero.

9. A method to position the surface of a substrate in a desired measurement range of a level sensor including a projection system, and a detector;

wherein the projection system comprises:
an emitter for emitting a radiation beam towards the substrate;
a projection grating positioned in between the emitter and the substrate, said projection grating comprising a measurement grating and an aperture, such that the radiation beam from the emitter incident on the projection grating is divided by the projection grating into a measurement radiation beam associated with the measurement grating and a capture radiation beam associated with the aperture;

wherein the detector comprises:
a first and second measurement detector;
a first and second capture detector;
a detection grating; and
an optical system with a first optical unit and a second optical unit;

wherein the detection grating comprises a ruled grating with multiple rules, wherein each rule of the multiple rules of the ruled grating comprises a first measurement facet associated with the first measurement detector and a second measurement facet associated with the second measurement detector;

wherein the first measurement facet is configured to refract radiation of the measurement radiation beam incident on said first measurement facet towards the first optical unit, wherein the first optical unit is configured to divert radiation refracted by the first measurement facet to the first measurement detector;

wherein the second measurement facet is configured to refract radiation of the measurement radiation beam incident on said second measurement facet towards the second optical unit;

wherein the second optical unit is configured to divert radiation refracted by the second measurement facet to the second measurement detector;

wherein the detection grating comprises a first capture element having a first capture facet associated with the first capture detector and a second capture facet associated with the second capture detector, said second capture facet being adjacent to the first capture facet;

wherein the first capture facet is configured to refract radiation of the capture radiation beam incident on said first capture facet towards the first optical unit, wherein the first optical unit is configured to divert radiation refracted by the first capture facet to the first capture detector;

wherein the second capture facet is configured to refract radiation of the capture radiation beam incident on said second capture facet towards the second optical unit; and wherein the second optical unit is configured to divert radiation refracted by the second capture facet to the second capture detector, said method comprising:

emitting a capture radiation beam towards the surface of the substrate to be reflected by the surface of the substrate;

moving the surface of the substrate until the capture radiation beam is incident on the first capture element and a difference between an output of the first capture detector and an output of the second capture detector is zero.

* * * * *